United States Patent [19]
Keown et al.

[11] Patent Number: 5,286,656
[45] Date of Patent: Feb. 15, 1994

[54] INDIVIDUALIZED PREPACKAGE AC PERFORMANCE TESTING OF IC DIES ON A WAFER USING DC PARAMETRIC TEST PATTERNS

[75] Inventors: Susan M. Keown; Myron J. Miske, both of Portland, Me.

[73] Assignee: National Semiconductor Corporation, Santa Clara, Calif.

[21] Appl. No.: 970,292

[22] Filed: Nov. 2, 1992

[51] Int. Cl.$^5$ .............................................. H01L 21/00
[52] U.S. Cl. ............................................ 437/7; 437/8; 324/158 R; 324/158 T
[58] Field of Search .................... 437/7, 8; 324/158 R, 324/158 T

[56] References Cited

U.S. PATENT DOCUMENTS

| | | |
|---|---|---|
| 3,927,371 | 12/1975 | Pomeranz et al. |
| 4,354,268 | 10/1982 | Michel et al. |
| 4,646,299 | 2/1987 | Schinabeck et al. |
| 4,875,002 | 10/1989 | Sakamoto et al. |
| 4,896,108 | 1/1990 | Lynch et al. |
| 4,926,234 | 5/1990 | Katoh |
| 4,956,611 | 9/1990 | Maltiel |
| 4,961,053 | 10/1990 | Krug ................................. 437/8 |
| 4,978,908 | 12/1990 | Mahant-Shetti et al. |
| 4,985,988 | 1/1991 | Littlebury |
| 5,003,253 | 3/1991 | Majidi-Ahy et al. |
| 5,039,602 | 8/1991 | Merrill et al. ..................... 437/7 |
| 5,059,899 | 10/1991 | Farnworth et al. ............... 437/8 |

Primary Examiner—Brian E. Hearn
Assistant Examiner—Kevin M. Picardat
Attorney, Agent, or Firm—Daniel H. Kane; Stephen R. Robinson

[57] ABSTRACT

A wafer structure and a method of fabricating and testing IC dies (10) on a wafer (12) are incorporated in a wafer fabrication process which produces IC dies having a selected sensitive AC parameter ($L_{EFF}, \beta, R$). Performance of the sensitive AC parameter generally falls within a first range of variation characteristic of the wafer fabrication process. A test structure or test pattern (TNMOS, TPMOS, TNPN, TR) is formed on substantially every die (10) of the wafer (12) for testing in a DC parametric test at the wafer level sorting stage before scribing and packaging the dies from the wafer. The test structures are constructed for generating test measurements in a DC parameter test reflecting the AC performance of the selected sensitive AC parameter. Substantially every die on the wafer is tested at the wafer level sorting stage using the test structures (TNMOS, TPMOS, TNPN, TR) in a DC parametric test. Those dies of the wafer reflecting AC performance of the selected sensitive AC parameter ($L_{EFF}, \beta, R$) within a second range of variation narrower than the first range are selected for packaging. The other dies of the wafer are rejected or sorted for other purposes before packaging for increasing the yield of packaged IC dies meeting AC specifications for AC performance within the narrower second range. The test structures include test NMOS (TNMOS) and test PMOS (TPMOS) transistors for test indication of effective gate length $L_{EFF}$ for CMOS transistors; test NPN transistors (TNPN) for reflecting the amplification factor $\beta$ for bipolar NPN transistors; and test resistors (TR) for test indication of effective resistance, isolation oxide encroachment, overetch or underetch, etc.

19 Claims, 3 Drawing Sheets

FIG I

INDIVIDUALIZED PREPACKAGE AC PERFORMANCE TESTING OF IC DIES ON A WAFER USING DC PARAMETRIC TEST PATTERNS

TECHNICAL FIELD

This invention relates to a new method of fabricating and testing integrated circuit (IC) dies on a wafer and a new wafer structure for individualized prepackage testing of the IC dies on the wafer before scribing and packaging. The invention provides individualized prepackage testing of AC performance of a selected sensitive AC parameter for all dies on the wafer at the wafer level stage during DC parametric testing. A DC parametric test structure or test pattern is incorporated in substantially every die of the wafer for generating test measurements in a DC parametric test reflecting the AC performance of the selected sensitive AC parameter. Dies are selected for packaging within a narrower range of AC performance than generally produced by the wafer fabrication process.

BACKGROUND ART

Upon completion of wafer fabrication steps forming the many integrated circuit dies on a wafer, the wafer proceeds to an intermediate testing stage while still in wafer form. This intermediate testing stage is commonly known as the DC parametric testing stage. It is referred to herein as the wafer level testing stage or simply the wafer level stage and includes two phases or steps of DC wafer level testing. First, selected test patterns formed at dedicated sites on the wafer are tested by a test pattern tester to check device parametrics indicating process variation. Second, each die on the wafer is tested on a DC parametric tester using a wafer probe for wafer sorting.

Typically, each wafer is formed with one or more process monitor test dies distributed across the wafer. The test dies are formed with DC test patterns for representative testing of selected DC parameters at the wafer level stage. The DC test patterns and DC parametric tests performed by the test pattern tester on the test patterns are designed to detect longer term changes in the IC wafer fabrication process for purposes of process control.

DC parametric testing is then performed on the individual dies of the wafer using a DC parametric tester. Physical contact is made with the bond pads of the respective dies using an automated wafer probe which steps from one die to another. The DC parameter tester forces DC currents and voltages for measuring DC parameters such as voltage thresholds, power rail voltages, and other voltages and currents of the respective IC component devices. Conventional DC parameter testers and wafer probes are generally limited to DC testing. The high impedance and high capacitance characteristic of the wafer probe make it impractical for testing AC parameters and high frequency characteristics. AC parameter testing is performed after cutting the wafer and packaging of individual dies or chips. However some limited low frequency AC testing has been conducted at the wafer level stage as described by Richard B. Merrill et al. in U.S. Pat. No. 5,039,602 on Aug. 13, 1991 for METHOD OF SCREENING AC PERFORMANCE CHARACTERISTICS DURING DC PARAMETRIC TEST OPERATION.

During the second phase of DC parameter testing, IC dies of the wafer that fail to meet specified DC parameter characteristics are marked for rejection, a step referred to as wafer sorting or "wafer sort". Following the "wafer sort", the wafer is shipped for scribing into individual integrated circuit dies and packaging of the acceptable chips. After packaging the integrated circuit devices then undergo more sophisticated AC parametric testing and dynamic AC function testing in integrated circuit device testers such as the Micro Component Technology, Inc. MCT 2000 Series Test System. Further description of AC parametric testing is found in the William H. Morong U.S. Pat. No. 5,101,153 issued Mar. 31, 1992 for PIN ELECTRONICS TEST CIRCUIT FOR IC DEVICE TESTING.

At the stage of AC parametric testing of individual packaged IC devices, a further percentage of the now packaged dies or chips are rejected. The objective of the manufacturing process is to maximize yield after the expense of scribing and packaging the individual dies of the wafer. A troublesome low yield of packaged dies occurs where the customer product specifications and acceptable range of performance of a selected sensitive AC parameter of an IC product may be substantially narrower than the general range of variation of the selected sensitive AC parameter produced by the IC fabrication process on line at the time of production. In that event, the yield may be particularly low with a high percentage of rejection of already packaged chips which fail the more sophisticated AC parametric tests and dynamic AC function tests.

By way of example, the cost of production of integrated circuit dies formed on a wafer at the wafer level sorting stage before scribing and packaging may be, for example in the range of ten cents per die. On the other hand, after scribing and packaging the cost per packaged IC device may be for example thirty cents per packaged die or chip. Low yield at the stage of AC parametric testing therefore disproportionately increases manufacturing cost of the acceptable packaged chips. Packaged IC device yield from AC parametric testing may therefore be unacceptably low and manufacturing costs excessive when customer product specifications for performance variation in a selected sensitive AC parameter are substantially narrower than the range of variation in the sensitive AC parameter generally produced by the on line wafer fabrication process.

OBJECTS OF THE INVENTION

The present invention is intended to reduce the manufacturing cost for IC device manufacturing applications in which an on line wafer fabrication process is used which may have process variation ranges, process limits or process tolerances for a selected sensitive AC parameter wider than the customer permitted design specifications, tolerances or limits for the IC device product.

It is an object of the invention to "filter" out those dies which do not meet narrower product specifications for a selected sensitive AC parameter at the wafer level sorting stage before the cost of wafer cutting and die packaging. The present invention seeks to provide such an AC performance test for substantially every individual die of the wafer.

A further object of the invention is to ascertain the AC performance for the selected sensitive AC parameter of substantially every individual die of the wafer during the DC parametric testing at the wafer level. In this respect the invention confines low yield to the lower cost wafer level sorting stage while greatly increasing yield at the stage of AC parametric testing of higher cost packaged IC devices.

DISCLOSURE OF THE INVENTION

In order to accomplish these results the invention provides a new method of fabricating and testing IC dies on a wafer in a wafer fabrication process producing IC dies having a selected sensitive AC parameter. The wafer fabrication process generally results in IC dies with AC performance of the sensitive AC parameter within a first range of variation characteristic of the wafer fabrication process. The method proceeds by forming on substantially every die of the IC dies of the wafer a test structure for testing in a DC parametric test at the wafer level stage before wafer cutting and die packaging.

According to the invention the test structures or test patterns are constructed for generating test measurements in a DC parametric test reflecting the AC performance of the selected sensitive AC parameter within the range of variation characteristic of the wafer fabrication process. The steps include testing substantially every die on the wafer at the wafer level sorting stage before scribing and packaging the dies. The test structure is used in the DC parametric test for reflecting the AC performance of the selected sensitive AC parameter.

According to the method, those dies on the wafer are selected which reflect AC performance of the selected sensitive AC parameter within a second range of variation narrower than the first range characteristic of the wafer fabrication process. These selected IC dies from the wafer are packaged while rejecting the other IC dies from the wafer before packaging. An advantage of this process is that the yield of packaged IC dies meeting AC specifications for AC performance of the selected sensitive AC parameter within the narrower second range is substantially increased.

At least one dedicated test bond pad is formed on substantially every die of the wafer. The test structure is coupled to the dedicated test bond pad for applying a selected test voltage during DC parametric testing with a DC parameter tester and wafer probe.

According to one example embodiment the sensitive AC parameter is the effective gate length $L_{EFF}$ for CMOS transistors. The test structure is a test NMOS transistor TNMOS having a gate node coupled to a drain node. The gate and drain nodes are coupled to a first bond pad of the die. The test NMOS transistor also has a source node coupled to a second bond pad. By way of example the first bond pad is the dedicated test bond pad for applying a selected test voltage during DC parametric testing and the second bond pad is a ground rail bond pad of the die.

The test structure may also include a test PMOS transistor TPMOS having a gate node coupled to a source node. The gate and source nodes are coupled to a third bond pad. The test PMOS transistor TPMOS has a drain node coupled to a fourth bond pad. By way of example the third bond pad is the dedicated test bond pad for applying a selected test voltage and the fourth bond pad is a ground rail bond pad of the die.

In another preferred example the selected sensitive AC parameter is the amplification factor $\beta$ for bipolar NPN transistors. The test structure is a test NPN transistor TNPN having a collector node coupled to a first bond pad, a base node coupled to a second bond pad, and an emitter node coupled to a third bond pad. By way of example the first bond pad is the supply power rail $V_{CC}$ bond pad of the die and the second and third bond pads are dedicated test bond pads for applying selected test voltages during DC parametric testing.

In a third example the selected sensitive AC parameter is a resistance parameter and the test structure is a test resistor TR having first and second nodes coupled to first and second bond pads. One of the first and second bond pads is a power rail bond pad of the die while the other bond pad is a dedicated test bond pad for applying a selected test voltage during DC parametric testing. The invention also includes the new wafer structure for individualized AC performance testing of every IC die at the wafer level during DC parametric testing.

Other objects, features and advantages of the invention are apparent in the following specification and accompanying drawings.

DESCRIPTION OF PREFERRED EXAMPLE EMBODIMENTS AND BEST MODE OF THE INVENTION

Figure 1:
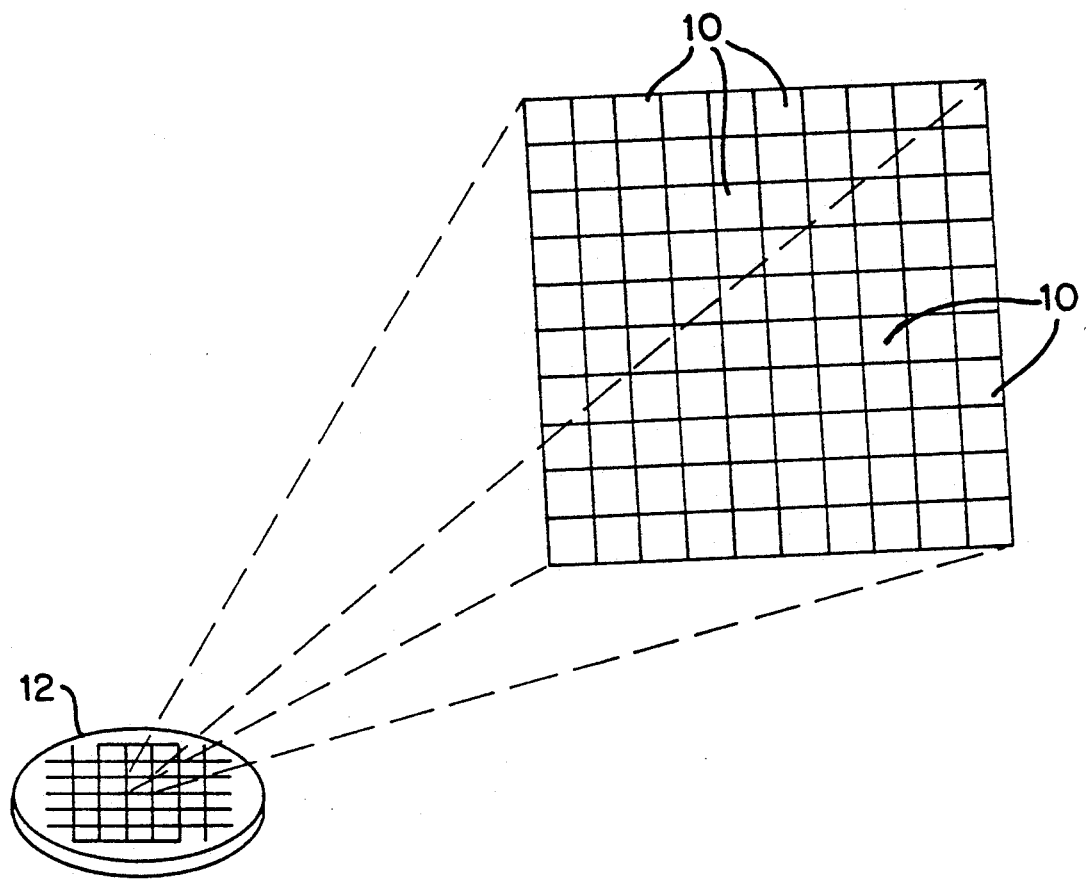
FIG. 1 is a simplified diagrammatic plan view of a wafer with detailed enlargement of a portion of the wafer showing individual dies of the wafer.

In order to identify which dies should be packaged and which discarded based on prospective AC performance while still at the wafer level, a test structure or test structures and corresponding dedicated bond pad or bond pads are incorporated in every die 10 of wafer 12 illustrated in FIG. 1. A portion of the wafer 12 is enlarged to show the individual integrated circuit devices, dies or chips 10. An illustrative simplified diagrammatic view of one of the IC dies 10 is illustrated in FIG. 2 for a CMOS or BICMOS IC die in which the selected sensitive AC parameter is the effective gate length $L_{EFF}$ of individual PMOS and NMOS transistors of the CMOS device.

Figure 2:
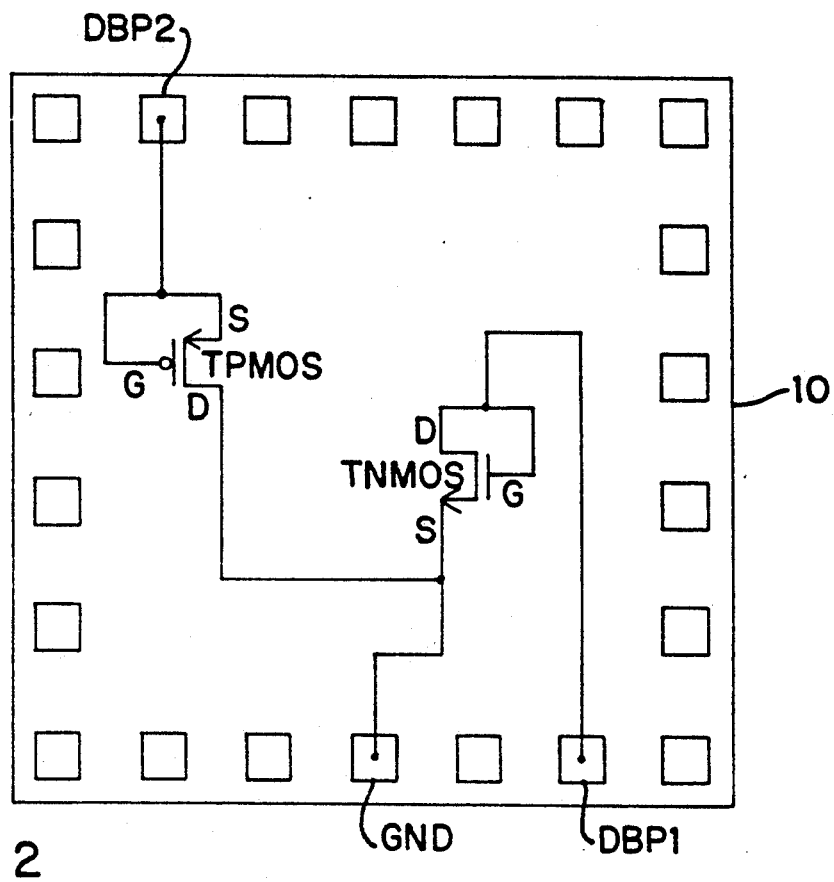
FIG. 2 is a simplified diagrammatic plan view of an integrated circuit die on a wafer showing test structures for indicating AC performance of the selected sensitive AC parameter $L_{EFF}$ for CMOS transistors during DC parametric testing.

As shown in the simplified diagrammatic view of FIG. 2 the test structure or test pattern for indicating AC performance of the sensitive AC parameter $L_{EFF}$ during DC parametric testing is a test NMOS transistor TNMOS having a gate node G coupled to drain node D. The gate and drain nodes G,D, are coupled to a first test bond pad or dedicated bond pad DBP1 for applying or forcing a test voltage during DC parametric testing. The source node S of test NMOS transistor TNMOS is, in this example, coupled to a ground rail GND bond pad of the IC die 10.

The test pattern or test structure also includes a test PMOS transistor TPMOS having the gate node G shorted to source node S. The gate and source nodes G,S, are in turn coupled to a second test bond pad or dedicated bond pad DBP2 for applying a test voltage during DC parametric testing. The drain node D of test PMOS transistor TPMOS is also coupled to a ground rail GND bond pad of the die 10.

During DC parametric testing the wafer probe of the DC parametric tester physically contacts the test bond pads DBP1 and DBP2 for applying or forcing a DC test voltage. The wafer probe also contacts the ground rail bond pads GND and other power rail bond pads for powering the chip and for providing current and voltage measurements. AC performance of the selected sensitive AC parameter of gate length $L_{EFF}$ can be inferred from these measurements using equations relating the parameters of the respective TNMOS and TPMOS transistors and in particular equations relating effective gate length $L_{EFF}$ to selected voltages and currents at nodes of the respective transistors.

For example, the current $I_{ds}$ measured from drain to source (electron flow source to drain) for a test NMOS or PMOS transistor is related to applied voltages and gate dimensions in the nonsaturated operating region of the MOS transistor as follows:

$$I_{ds} = K\ W/L_{eff}((V_{gs}-V_t)\ V_{ds}-V_{ds}^2/2). \quad (1)$$

$V_{ds}$ is the potential applied across the drain and source of the MOS transistor, $V_{gs}$ is the gate to source voltage, and $V_t$ is the threshold voltage required to establish a conductive channel through the transistor, $V_{gs}-V_t$ being the effective gate voltage. $L_{eff}$ is the effective gate length or channel length established by the gate, W the gate width or channel width, and K a constant of the semiconductor materials. In the nonsaturated operating region of the MOS transistor, the voltage along the channel between drain and source is approximately on average $V_{ds}/2$. For the saturated operating region of the MOS transistor $V_{ds}=V_{gs}-V_t$ and the relationship between measured drain/source current $I_{ds}$ and relevant parameters is defined as follows:

$$I_{ds} = K\ W/L_{eff}(V_{gs}-V_t)^2/2. \quad (2)$$

The relationships between the parameters, determination of threshold voltage $V_t$, and the constituents of the constant K are further developed in basic texts such as Douglas A. Pucknell and Kamran Eshraghian, *BASIC VLSI DESIGN SYSTEMS AND CIRCUITS*, Second Edition, Prentice Hall, N.Y. 1988, Chapter 2, "Basic Electrical Properties of MOS Circuits", pp 23-27 et.seq.

Figure 2A:
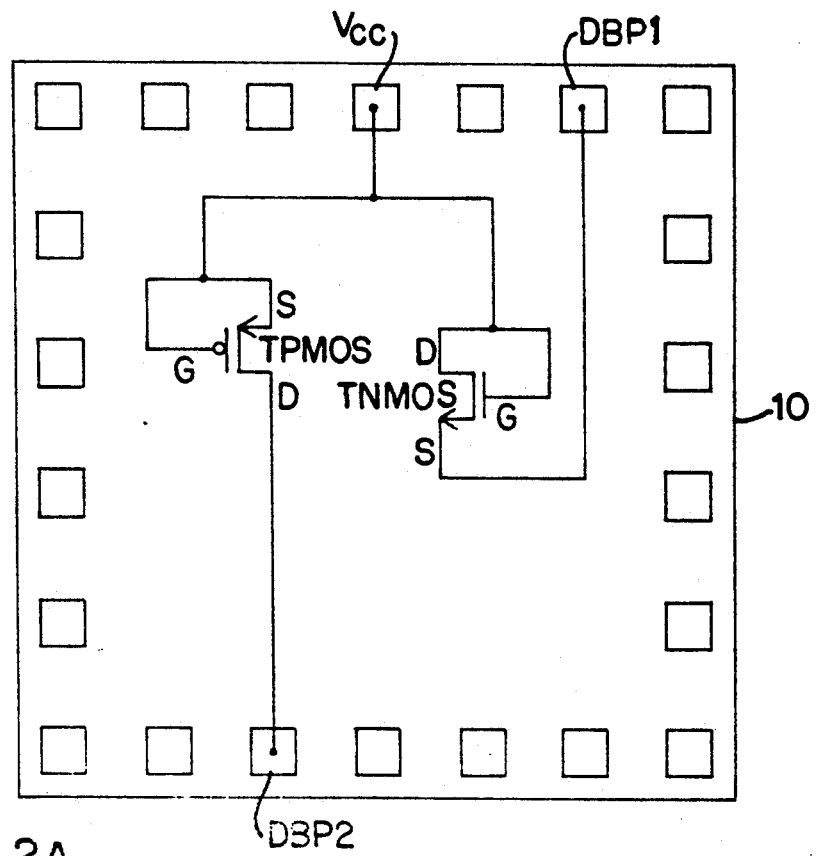
FIG. 2A is a simplified diagrammatic plan view of an IC die on a wafer showing an alternative circuit coupling configuration for the test structures of FIG. 2.

Alternative configurations for the test pattern transistors TNMOS and TPMOS of FIG. 2 are illustrated in FIG. 2A. As shown in FIG. 2A the shorted gate and drain nodes G,D of test NMOS transistor TNMOS, and the shorted gate and source nodes G,S of test PMOS transistor TPMOS are coupled respectively to a supply rail $V_{CC}$ bond pad of the IC die 10. The source node S of TNMOS and the drain node D of TPMOS are coupled to respective test dedicated bond pads DBP1 and DBP2. Test voltage differences can be applied across the respective test transistors TNMOS, TPMOS between the high potential supply rail $V_{CC}$ and respective test voltages applied at test bond pads DBP1,DBP2.

Figure 3:
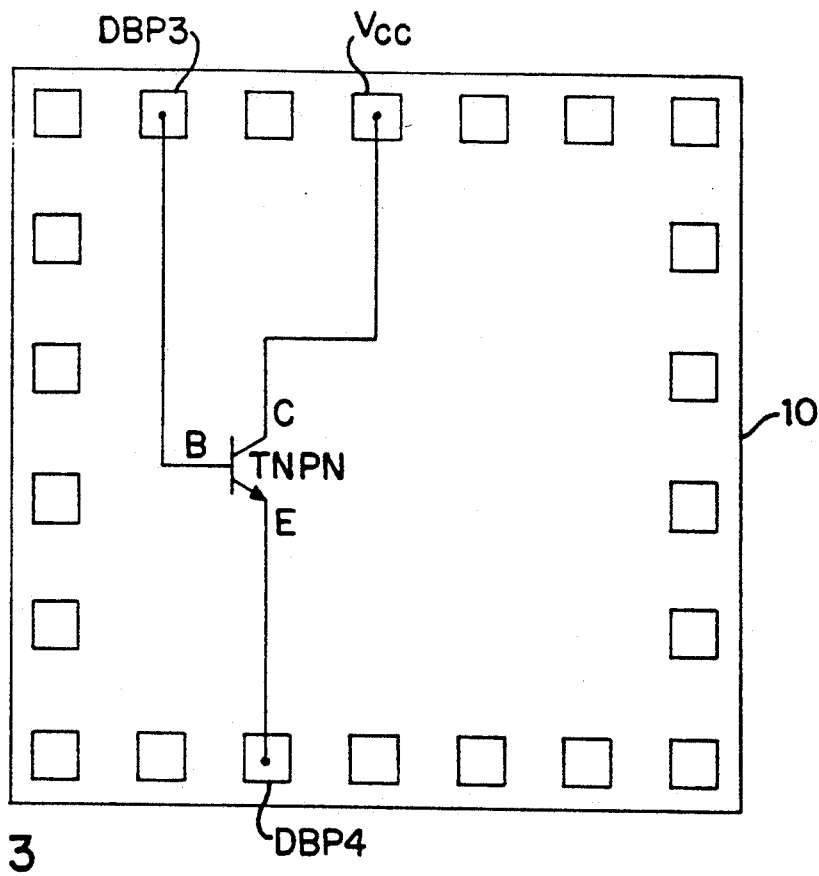
FIG. 3 is a simplified diagrammatic plan view of an integrated circuit die on a wafer showing the test structure for indicating AC performance of the selected sensitive AC parameter $\beta$ for NPN transistors during DC parametric testing.

Another die 10 composed primarily of NPN transistors from a bipolar or BICMOS wafer 12 is illustrated in the simplified diagrammatic view of FIG. 3. In this example the selected sensitive AC parameter is the amplification factor or amplification multiplier $\beta$ of NPN transistors.

The test structure is a test NPN transistor TNPN having a collector node C coupled to a supply rail $V_{CC}$ bond pad of the IC die 10. The base node B and emitter node E are coupled to respective test bond pads or dedicated bond pads DBP3 and DBP4.

During DC parametric testing representative test voltages are applied at the base and emitter nodes of TNPN through dedicated bond pads DBP3 and DBP4. AC performance of the selected sensitive amplification parameter $\beta$ can be inferred from equations relating $\beta$ to selected voltages and currents at nodes of the test NPN transistor.

For example, the amplification factor $\beta$ of bipolar transistors is dependent on both the base emitter potential $V_{be}$ and collector emitter voltage $V_{CE}$. These parameter relationships and equations are further developed in Ian Getreu, *Modeling the Bipolar Transistor*, Tektronix, Inc., Beaverton, Oreg. 1976. In practical application, a DC operating point is selected for testing the test bipolar transistors TNPN for comparison with empirically established standards.

The examples of FIGS. 2, 2A and 3 illustrate dies for standard 20 pin IC devices modified according to the invention. In addition to the standard 20 bond pads corresponding to the 20 pins of the final packaged device, two dedicated test bond pads DBP are also provided. In FIGS. 2 and 2A the dedicated test bond pads are identified as DBP1 and DBP2, while in FIG. 3 they are identified as DBP3 and DBP4. The only purpose of the dedicated test bond pads is for contact with the wafer probe during wafer level testing for indicating prospective AC performance of the selected sensitive AC parameter. In the final packaging of the device, no lead wires are bonded to the dedicated test bond pads which remain "dead end" bond pads in the final package. The two extra bond pads in the illustrated examples are provided for the new test function only.

Figure 4:
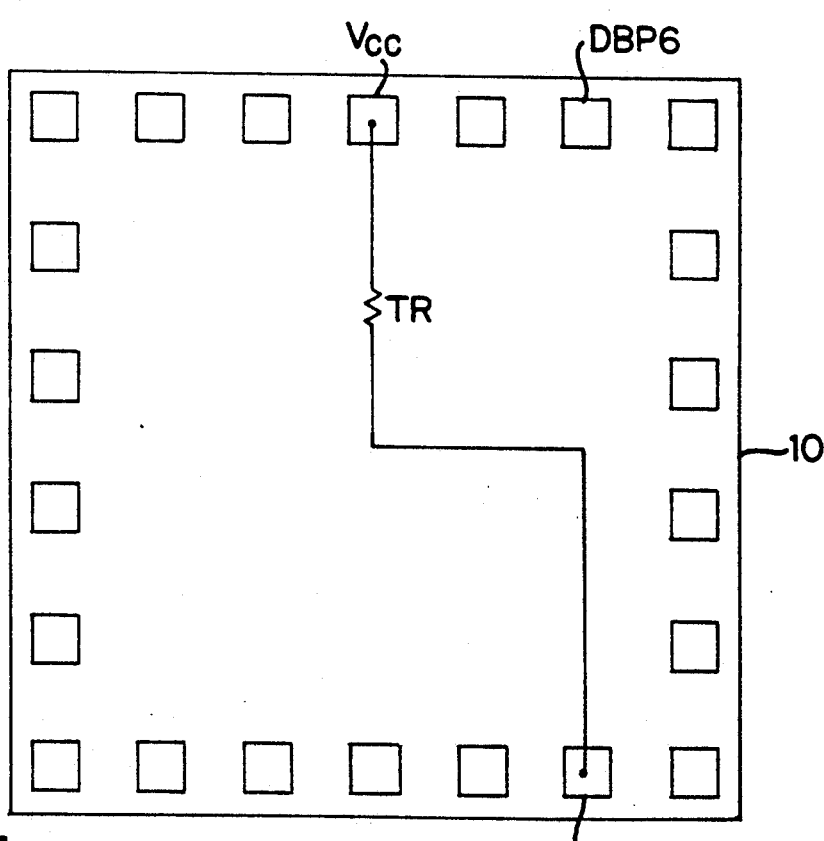
FIG. 4 is a simplified diagrammatic plan view of an integrated circuit die on a wafer showing a test structure for indicating AC performance of a selected AC resistance parameter during DC parametric testing.

A further example of a test structure or test pattern for the integrated circuit dies 10 of wafer 12 is illustrated in FIG. 4. In this example the sensitive AC parameter is a resistance parameter. The test pattern is a test resistor TR having a first node for example connected to the supply rail $V_{CC}$ bond pad of IC die 10 and a second node coupled to a dedicated test bond pad DBP5. Alternatively one electrode may be connected to the ground rail GND bond pad while the other is coupled to the dedicated test bond pad DBP5. In the example of FIG. 4, additional dedicated test bond pad DBP6 is also available for use with other test structures for indicating performance of an AC parameter during wafer level testing.

Determination of resistance from voltage and current measurements may be used to infer a number of different sensitive AC parameters. Test measurements on the test pattern TR during DC parametric testing may be used to infer encroachment of isolation oxide by its effect on the resistance of the test resistor TR. In the case of a polysilicon resistor, test measurements during DC parametric testing may be used to infer extent of polysilicon overetch on underetch of the poly resistor as well as overetch or underetch of other poly components of the IC device.

For example measurement of voltage and current across the test resistor TR indicates resistance R which is related to the dimensions of the resistor TR including cross-sectional area A of the resistor, current path length l and current path width W as follows:

$$R = pl/A = R_s l/w. \qquad (3)$$

"p" is the resistivity of the resistor material in Ohm meters and $R_s$ is the sheet resistance of the resistor material where $R_s = p/t$ and t is the thickness of the resistor material. Sheet resistance $R_s$ is commonly referred to in units of ohms per square because $R_s$ in ohms is the resistance of any square resistor of the resistive material. Total resistance R may therefore be expressed in the number n of square $R_s$, $R = nR_s$, where $n = l/w$.

Equations relating the resistance and dimension parameters for passive resistor elements are further developed in Arthur B. Glaser and Gerald E. Subak-Sharpe, *Integrated Circuit Engineering Design, Fabrication, and Applications*, Addison Wesley Publishing Company, Reading, Mass., 1979, Chapter 4, "Passive Elements" pp 116-122. Total resistance variation ΔR due to all causes includes δR/δT ΔT variation due to temperature variations, δR/δR$_s$ ΔR$_s$ variations due to changes in sheet resistance, and δR/δnΔn variations due to change in dimensions l/w. For a long narrow resistor TR, the later parametric variation predominates, and changes in the number of squares n can be correlated with loss of width W or width variation in the case of poly resistors or oxide encroachment variation in the case of walled resistors.

On the basis of inferred AC performance of the respective sensitive AC parameter indicated during DC parametric testing, a narrower range of variation can be selected than is generally produced by the on line IC fabrication process. In this way the IC dies can be "filtered" to optimize yield of packaged IC dies for a particular product specification having a narrower range of variation of the sensitive AC parameter and with lower manufacturing costs.

The method of the present invention can also be used for double sorting or multiple sorting of dies on a wafer. Particular types of IC devices may be specified and classified by different levels of AC performance. For example, programmed logic devices (PLD's) are specified by AC performance propagation delay such as 5nS, 7nS, 10nS, and 15nS parts. Other families of IC chip products also require sorting by speed. With appropriate test structures on every die, the present invention permits multiple sorting of dies on the wafer into different classes depending upon DC parametric measurements on the test structures reflecting, for example, propagation delay or speed.

A test structure for multiple sorting by speed may be selected according to the speed sensitive limiting parameter. For example if the individual dies are speed sensitive to variation in resistance, test structure resistors TR can be formed on each die of the wafer for testing and reflecting AC speed performance during DC parametric testing at the wafer level. If CMOS transistors are the speed sensitive limiting components then test NMOS and PMOS transistors TNMOS, TPMOS can be formed on each die of the wafer for DC parametric testing of DC signals reflecting speed of the IC die. The dies can be sorted into multiple sort categories for separate packaging according to the prospective AC performance category for speed or signal propagation delay.

While the invention has been described with reference to particular example embodiments it is intended to cover all modifications and equivalents within the scope of the following claims.

We claim:

1. A method of fabricating and testing IC dies on a wafer in a wafer fabrication process producing IC dies having a selected sensitive AC parameter with performance of the sensitive AC parameter within a first range of variation characteristic of the wafer fabrication process, comprising:

forming on substantially every die of the IC dies of the wafer a test structure for testing in a DC parametric test at the wafer level sorting stage before scribing and packaging the dies from the wafer;

constructing said test structure for generating test measurements in a DC parametric test reflecting the AC performance of the selected sensitive AC parameter within the range of variation characteristics of the wafer fabrication process;

constructing at least one dedicated test bond pad on substantially every die of the wafer coupled to said test structure for applying a selected test voltage during DC parametric testing with a DC parameter tester and wafer probe;

testing substantially every die on the wafer at the wafer level stage before scribing and packaging the dies using said test structure in a DC parametric test reflecting the AC performance of said selected sensitive AC parameter.

selecting those dies on the wafer reflecting AC performance of the selected sensitive AC parameter within a second range of variation narrower than the first range characteristic of the wafer fabrication process;

and packaging the selected IC dies from the wafer while rejecting or otherwise sorting the other IC dies from the wafer before packaging for increasing the yield of packaged IC dies meeting AC specifications for AC performance of the selected sensitive AC parameter within the narrower second range.

2. The method of claim 1 wherein the selected sensitive AC parameter comprises effective gate length $L_{EFF}$ for CMOS transistors and wherein the test structure comprises an NMOS transistor TNMOS having a gate node coupled to a drain node, said gate and drain nodes being coupled to a first bond pad of the die, said test NMOS transistor TNMOS having a source node coupled to a second bond pad.

3. The method of claim 2 wherein one of the first and second bond pads is a power rail bond pad of the die and the other bond pad is a dedicated test bond pad TBP1 for applying a test voltage during DC parametric testing.

4. The method of claim 3 wherein the first bond pad is the dedicated test bond pad TBP1 for applying a selected test voltage and wherein the second bond pad is a ground rail GND bond pad of the die.

5. The method of claim 2 wherein the test structure also comprises a test PMOS transistor TPMOS having a gate node coupled to a source node, said gate and source nodes being coupled to a third bond pad, said test PMOS transistor TPMOS having a drain node coupled to a fourth bond pad.

6. The method of claim 5 wherein one of the third and fourth bond pads is a power rail bond pad of the die and the other bond pad is a dedicated test bond pad TBP2 for applying a test voltage during DC parametric testing.

7. The method of claim 1 wherein the selected sensitive AC parameter is the amplification factor $\beta$ for bipolar NPN transistors and wherein the test structure comprises a test NPN transistor TNPN having a collector node coupled to a first bond pad, a base node coupled to a second bond pad, and an emitter node coupled to a third bond pad.

8. The method of claim 7 wherein the first bond pad is a supply power rail $V_{CC}$ bond pad of the die and the second and third bond pads are dedicated test bond pads TBP3, TBP4 for applying selected test voltages during DC parametric testing.

9. The method of claim 1 wherein the selected sensitive AC parameter is a resistance parameter and wherein the test structure comprises a test resistor TR having first and second nodes coupled to first and second bond pads, one of said first and second bond pads being a power rail bond pad of the die and the other bond pad being a dedicated test bond pad TBP5 for applying a selected test voltage during DC parametric testing.

10. The method of claim 1 comprising the step of sorting the dies of the wafer at the wafer level stage by multiple sorting into a plurality of classes of dies according to different AC performance characteristics of the selected sensitive AC parameter determined by said DC parametric testing for separate packaging of said multiple sort classes.

11. An improved wafer structure for testing IC dies fabricated on the wafer, said dies having a selected sensitive AC parameter with performance of the sensitive AC parameter within a first range of variation of the dies on the wafer, comprising:

a plurality of test structures, at least one test structure being constructed on substantially every die of the wafer, said test structures being constructed for testing in a DC parametric test at the wafer level stage before scribing and packaging the dies from the wafer;

said test structures being constructed for generating test measurements in a DC parametric test at the wafer level sorting stage reflecting the AC performance of said selected sensitive AC parameter within said first range of variation;

and at least one dedicated test bond pad constructed on substantially every die of the wafer coupled to said test structure for applying selected test voltages to the test structure of substantially every die of the wafer during DC parametric testing.

12. The wafer structure of claim 11 wherein the selected sensitive AC parameter comprises the effective gate length $L_{EFF}$ of CMOS transistors, and wherein the test structure on substantially every die of the wafer comprises a test NMOS transistor TNMOS having a gate node coupled to a drain node, said gate and drain nodes being coupled to a first bond pad of the die, said test NMOS transistor TNMOS having a source node coupled to a second bond pad of the die.

13. The wafer structure of claim 12 wherein one of the first and second bond pads is a power rail bond pad of the die and the other bond pad is a dedicated test bond pad TBP1 for applying a test voltage.

14. The wafer structure of claim 13 wherein the first bond pad is the dedicated test bond pad TBP1 and wherein the second bond pad is a ground rail GND bond pad of the die.

15. The wafer structure of claim 12 wherein the test structure on substantially every die of the wafer further comprises a test PMOS transistor TPMOS having a gate node coupled to a source node, said gate and source nodes being coupled to a third bond pad of the die, said test PMOS transistor TPMOS having a drain node coupled to a fourth bond pad of the die.

16. The wafer structure of claim 15 wherein the third bond pad is a dedicated test bond pad TBP2 for applying a selected test voltage during DC parametric testing and wherein the fourth bond pad is a ground rail GND bond pad of the die.

17. The wafer structure of claim 11 wherein the selected sensitive AC parameter is the amplification factor $\beta$ for bipolar NPN transistors and wherein the test structure on substantially every die of the wafer comprises a test NPN transistor TNPN having a collector node coupled to a first bond pad of the die, a base node coupled to a second pad of the die, and an emitter node coupled to a third bond pad of the die.

18. The wafer structure of claim 17 wherein the first bond pad is a supply power rail $V_{CC}$ bond pad of the die, and the second and third bond pads are dedicated test bond pads TBP3,TBP4 for applying selected test voltages during DC parametric testing.

19. The wafer structure of claim 11 wherein the selected sensitive AC parameter is a resistance parameter and wherein the test structure on substantially every die of the wafer comprises a test resistor TR having first and second nodes coupled to first and second bond pads of the die, one of said bond pads being a power rail bond pad of the die and the other bond pad being a dedicated test bond pad TBP5 for applying selected test voltages.

* * * * *